United States Patent [19]

Hashimoto et al.

[11] Patent Number: 5,093,224
[45] Date of Patent: Mar. 3, 1992

[54] PROCESS FOR PRODUCING FINE PATTERNS USING CYCLOCARBOSILANE

[75] Inventors: Kazuhiko Hashimoto, Moriguchi; Kenji Kawakita, Neyagawa; Noboru Nomura, Kyoto, all of Japan

[73] Assignee: Matsushita Electric Industrial Co., Ltd., Osaka, Japan

[21] Appl. No.: 496,020

[22] Filed: Mar. 20, 1990

[30] Foreign Application Priority Data

Mar. 27, 1989 [JP] Japan .................................. 1-075317

[51] Int. Cl.$^5$ ........................ G03F 7/30; G03F 7/38; G03C 5/00
[52] U.S. Cl. .................... 430/296; 430/313; 430/323; 430/330; 430/317; 430/967; 430/270
[58] Field of Search ............. 430/296, 313, 323, 330, 430/317, 967

[56] References Cited

U.S. PATENT DOCUMENTS

| 4,464,460 | 8/1984 | Hiraoka et al. | 430/323 |
| 4,481,279 | 11/1984 | Naito et al. | 430/296 X |
| 4,810,601 | 3/1989 | Allen et al. | 430/296 X |
| 4,863,833 | 9/1989 | Fukuyama et al. | 430/296 X |

FOREIGN PATENT DOCUMENTS 2156834  10/1985  United Kingdom .

OTHER PUBLICATIONS

Patent Abstracts of Japan, vol. 11, No. 270 (P-611)(2717) Sep. 3, 1987, of JP-A-62 71945 (Toshiba Corp.) Apr. 2, 1987.

*Primary Examiner*—Cynthia Hamilton
*Attorney, Agent, or Firm*—Stevens, Davis, Miller & Mosher

[57] ABSTRACT

A process for forming a fine pattern comprising the steps of forming an organic polymer film on a semiconductor substrate followed by heat treatment, applying a resist film consisting of a cyclocarbosilane represented by the general formula (I):

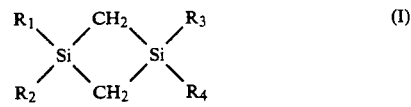

where $R_1$, $R_2$, $R_3$ and $R_4$ are each hydrogen or an alkyl group, a polymer resin, and a photo acid generator, on the organic polymer film followed by heat treatment, exposing to an electric charged beam, forming a resist pattern by developing, and etching the organic polymer film while using the resist pattern as a mask. According to the present invention, a dry etching resistant precise fine resist pattern can be formed with high sensitivity.

4 Claims, 4 Drawing Sheets

F I G. 3A
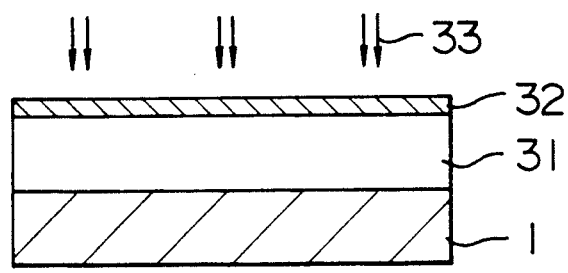
F I G. 3B
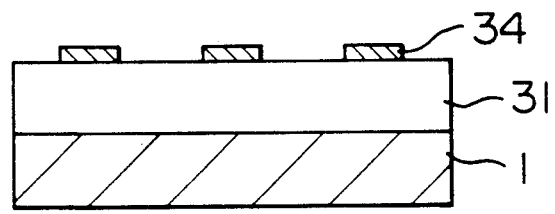
F I G. 3C
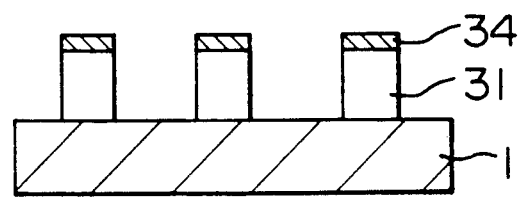

PROCESS FOR PRODUCING FINE PATTERNS USING CYCLOCARBOSILANE

The present invention relates to a process for forming a fine pattern. The present invention is used to produce semiconductor devices and integrated circuits by forming patterns with electron beam.

Hitherto, in producing IC or LSI, pattern formation is attained by photolithography with ultraviolet rays. With the miniaturization of devices, use of high NA stepper lens and short wavelength light source is proceeding, however it accompanies the disadvantage of shallow focus depth. With the miniaturization of the pattern of LSI devices and production of ASIC, electron beam lithography is also being used. For the fine pattern formation by electron beam lithography, a positive type electron beam resist is an essential element. As a resist, poly(methyl methacrylate) (PMMA) is known to possess highest resolution, but it has the disadvantage of low sensitivity. Therefore, there has been lately numbers of proposals to increase the sensitivity of the positive type electron beam resist. For example, positive type electron beam resists such as poly(butyl methacrylate), a copolymer of methyl methacrylate and methacrylic acid, a copolymer of methacrylic acid and acrylonitrile, a copolymer of methyl methacrylate and isobutylen, polybuten-1-sulfone, poly(isopropenyl ketone), and fluoro polymethacrylate have been disclosed. These resists have an electron withdrawing group as a side chain, or easily degradable bond in the principal chain. The aim is to attain high sensitivity by the ease of principal chain scission by electron beam, but it cannot be agreed that the need for both high resolution and high sensitivity is sufficiently satisfied.

In addition, in a conventional electron beam lithography, there are problems of low dry etch resistance of an electron beam resist, and a harmful influence on pattern precision because of proximity effect due to forward scattering and back scattering of the electron.

In order to solve such problems, a multilayer resist process, in which the function of the resist is shared by a pattern forming layer and planarizing layer, is a very effective process. FIGS. 4A–4D are figures to explain the three-layer resist process in the electron beam lithography. On the semiconductor substrate 1, an organic film is applied to a thickness of 2-3 μm as a bottom layer 41 to suppress the proximity effect, as an intermediate layer 42 an inorganic film such as a SiO₂ film or the like or an inorganic polymer film such as SOG (spin on glass) or the like is applied to a thickness of 0.2 μm, and as a top layer an electron beam resist 43 is applied to a thickness of 0.5 μm (FIG. 4A). After exposure to electron beam 44, resist pattern 45 can be obtained by developing (FIG. 4B). Dry etching of the intermediate layer 42 is carried out using the resist pattern as a mask (FIG. 4C), and dry etching of the bottom layer 41 is carried out using the intermediate layer as a mask (FIG. 4D). Using the multilayer resist process as explained above, fine patterns can be formed with a high aspect ratio.

As explained above, three-layer resist process is an effective method, but there are problems such as complexity of the process and change of resist dimension at the time of pattern transfer. Especially, application of a thick bottom layer is needed because of a heavy influence on pattern precision due to the proximity effect at electron beam exposure.

Silicon containing resists and inorganic resists which can act as a mask to the bottom layer and as a resist layer simultaneously have thus been developed. For example, there are a polymer with siloxane bond in the principal chain, a ladder type polysiloxane, and a chalcogenide glass type inorganic resist, but these do not yet have sufficient dry etch resistance, and their sensitivity and resolution are low, therefore they are still far from practical use. These resists use an organic solvent for a developing solution, which means large sensitivity fluctuation and poor dimension stability of the resists, and less process margin. Environment pollution is also a problem.

To solve these problems, the present inventors eagerly studied high sensitivity negative type electron beam resists, and as a result have completed the present invention.

The present invention relates to a process for forming a fine pattern comprising the steps of forming an organic polymer film on a semiconductor substrate followed by heat treatment, applying a resist film consisting of a cyclocarbosilane represented by the general formula (I):

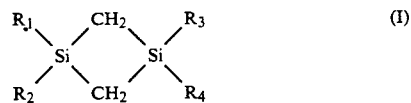

where $R_1$, $R_2$, $R_3$ and $R_4$ are each hydrogen or an alkyl group, a polymer resin, and a photo acid generator, on the organic polymer film followed by heat treatment, exposing to an electric charged beam, forming a resist pattern by developing, and etching the organic polymer film while using the resist pattern as a mask.

The present invention also relates to a process for forming a fine pattern comprising the steps of forming an organic polymer film on a semiconductor substrate followed by heat treatment, applying a resist consisting of a polysilane represented by the general formula (II):

where $R_1$, $R_2$, $R_3$ and $R_4$ are each hydrogen or an alkyl group, and n is a positive integer, and a cyclocarbosilane represented by the general formula (I):

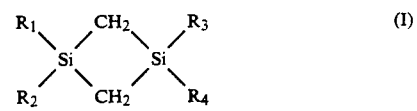

where $R_1$, $R_2$, $R_3$ and $R_4$ are each hydrogen or an alkyl group, on the organic polymer film followed by heat treatment, exposing to an electric charged beam, forming a resist pattern by developing, an etching the organic polymer film while using the resist pattern as a mask.

Further, the present invention relates to a process for producing a fine pattern comprising the steps of forming an organic polymer film on a semi-conductor substrate followed by heat treatment, applying a resist consisting of a polydisilanylene phenylene represented by the general formula (III):

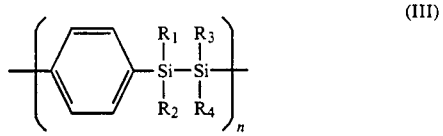

where $R_1$, $R_2$, $R_3$ and $R_4$ are each hydrogen or an alkyl group, and n is a positive integer,
and a cyclocarbosilane represented by the general formula (I):

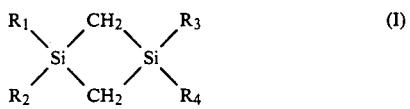

where $R_1$, $R_2$, $R_3$ and $R_4$ are each hydrogen or an alkyl group,
on the organic polymer film followed by heat treatment, exposing to an electric charged beam, forming a resist pattern by developing, and etching the organic polymer film while using the resist pattern as a mask.

An object of the present invention is, in electric charged beam direct writing using electron beam, a focused ion beam or the like with a single layer resist or multilayer resist, to provide a process for forming a fine pattern with high sensitivity to form a high dry etch resistant resist pattern. A process for forming a fine pattern of the present invention is, by use of a material consisting of a cyclocarbosilane, a polymer resin and an acid generator, effective in forming a precise fine resist pattern of high dry etch resistance with high sensitivity, and greatly contributes to the production of ultra large scaled integrated circuits.

Other objects and advantages of the present invention will become apparent from the following description and attached drawings.

BRIEF DESCRIPTION OF THE DRAWINGS

In the attached drawings, FIG. 1A to FIG. 3C are cross sections of example processes of the present invention.

DETAILED DESCRIPTION OF THE INVENTION

Figure 1A:
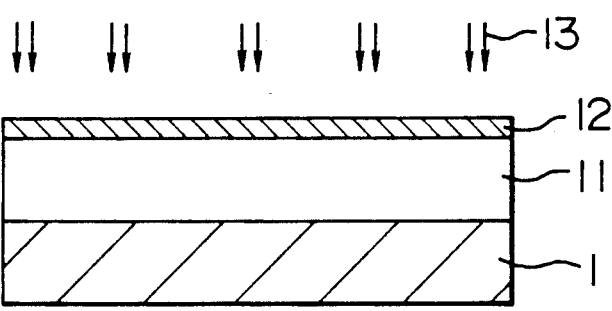

In the present invention, a three-component material consisting of a cyclocarbosilane represented by the general formula (I):

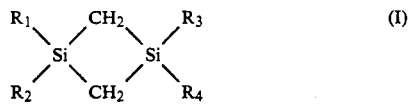

where $R_1$, $R_2$, $R_3$ and $R_4$ are each hydrogen or an alkyl group,
a polymer resin and a photo acid generator (resist A) is used as a resist.

As the above-mentioned polymer resin, phenol resins such as novolak resin and the like are used. Since these polymer resin act as solution inhibitors, an aqueous organic alkaline solution can be used as a developing solution.

As the photo acid generator in the present invention, organic halides such as 1,1-bis(p-chlorophenyl)-2,2,2-trichloroethane and the like are used.

When this resist is exposed, a Lewis acid is formed from the acid generator, and the cyclocarbosilane polymerizes as shown below by the catalytic effect of the Lewis acid.

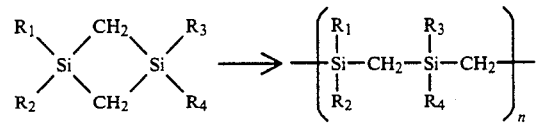

The resist subject to the polymerization by Lewis acid forms a negative type pattern. Since the resist contains a phenol resin such as novolak resin or the like, an organic alkaline developing solution can be used.

Also there is used as a resist, a material consisting of a polysilane represented by the general formula (II) as a photo initiator:

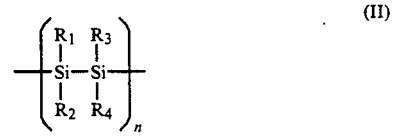

where, $R_1$, $R_2$, $R_3$ and $R_4$ are each hydrogen or an alkyl group, and n is a positive integer,
and the above-mentioned cyclocarbosilane (resist B).

This resist, when exposed, polymerizes similarly as described above, and forms a high molecular compound, thereby forming a negative type pattern.

Also, a material consisting of a polydisilanylene phenylene represented by the general formula (III) as a photo initiator:

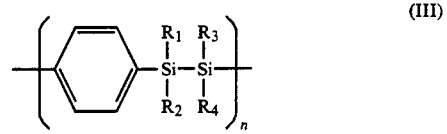

where $R_1$, $R_2$, $R_3$ and $R_4$ are each hydrogen or an alkyl group, and n is a positive integer,
and the above-mentioned cyclocarbosilane (resist C) can be used as a negative type resist.

In the above general formulae (I), (II) and (III), alkyl groups represented by $R_1$-$R_4$ preferably have 1 to 10 carbon atoms, and more preferably 1 to 5 carbon atoms.

The above polysilane (II) and polydisilanylene phenylene (III) have a molecular weight of 100,000-hundreds of thousands, preferably 100,000-300,000.

By using a silicon-containing material mentioned above as the top layer of a double layer resist, a multilayer resist can be easily formed. Since the above mentioned silicon-containing material has only Si atoms, C atoms and phenyl groups in the principal chain, dry etch resistance is sufficiently good, and sensitivity sufficiently good because of a chemical amplification technique, a precise fine resist pattern can formed.

A process for forming a fine pattern of the present invention is described below in due order.

First, an organic polymer film is formed on a semiconductor substrate. Polymers usable for forming the organic polymer film include polymers such as PMMA and novolak resin and the like used in the conventional multi-layer resist processes.

Next, the organic polymer film is heat treated. Heat treatment is carried out at 150°–220° C. for 20–30 minutes.

One of the above-mentioned resists A–C is applied on this organic polymer film and heat treated as described above.

The obtained film is exposed to an electric charged beam, and developed to form a resist pattern. As the electric charged beam, electron beam or the like is used. Methyl isobutyl ketone, an aqueous organic alkaline solution or the like is used as a developing solution.

By etching the organic polymer film, using the above resist pattern as a mask, a fine pattern is formed.

According to the present invention, fine patterns are easily formed by a resist process using the above-mentioned high sensitivity silicon-containing electron beam resist. Process can be simplified, dimension shift at pattern transfer can be avoided, an aqueous solution can be used as a developing solution with high sensitivity, and a precise high resolution fine resist pattern can be formed.

The present invention is explained below in more detail with reference to Examples and Referential Examples. The present invention, however, should not be construed to be restricted by the Examples.

REFERENTIAL EXAMPLE 1

An ethyl cellosolve acetate solution containing a cyclocarbosilane represented by the following formula:

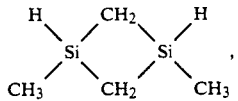

a phenol resin and a photo acid generator 1,1-bis(p-chlorophenyl)-2,2,2-trichloroethane, was dropped on a semiconductor substrate and spin-coated at 2,000 rpm. This was baked at 150° C. for 20 minutes to produce a 1.2 μm thick resist film. The film was exposed to electron beam at an accelerating voltage of 30 kV and a dose of 10 μC/cm² and subjected to development with an aqueous organic alkaline solution to provide a precise negative type resist pattern.

REFERENTIAL EXAMPLE 2

A polysilane represented by the following formula:

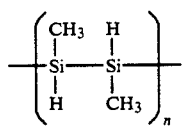

and a cyclocarbosilane were dissolved in ethyl cellosolve acetate, and unsolubles were filtered off to prepare a resist solution. This resist solution was applied to a semiconductor substrate, spin-coated at 2,000 rpm, baked at 150° C. for 20 minutes to form a 1.2 μm thick resist film. The film was subjected to electron beam exposure at an accelerating voltage of 30 kV and a dose of 10 μC/cm², developed with methyl isobutyl ketone (MIBK) to provide a precise negative type resist pattern.

REFERENTIAL EXAMPLE 3

A polydisilanylene phenylene represented by the following formula:

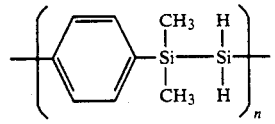

and a cyclocarbosilane were dissolved in cellosolve acetate, and unsolubles filtered off to prepare a resist solution. This resist solution was dropped on a semiconductor substrate, spin-coated at 2,000 rpm, and baked at 150° C. for 20 minutes to form a 1.2 μm thick resist film. The film was exposed to electron beam at an accelerating voltage of 30 kV and a dose of 10 μC/cm², and developed with MIBK to provide a precise negative type resist pattern.

EXAMPLE 1

Figure 1B:
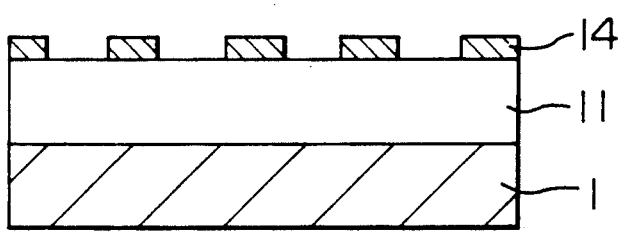
Figure 1C:
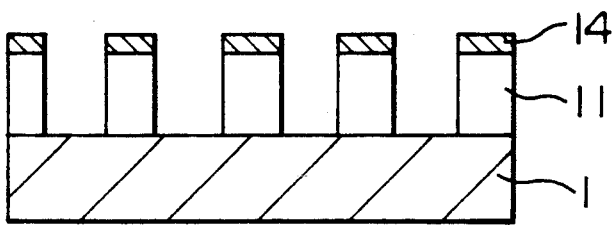

This example is explained referring to FIG. 1A to 1C. Novolak resin was applied to a semiconductor substrate 1 for forming the organic polymer film constituting the bottom layer 11 to a thickness of 2 μm, and baked at 220° C. for 20 minutes. The resist used in Referential Example 1 was applied on the organic polymer film as an electron beam resist 12 to a thickness of 0.3 μm and baked at 150° C. for 20 minutes (FIG. 1A). Next the resist was subjected to electron beam 13 exposure at an accelerating voltage of 30 kV and a dose of 10 μC/cm² and developed with an aqueous organic alkaline solution to produce a precise fine resist pattern 14 (FIG. 1B). The bottom layer 11 was etched using this resist pattern as a mask, and a precise and vertical fine resist pattern was obtained (FIG. 1C).

As explained above, in this example, since the Lewis acid formed from the acid generator acted as a catalyst and thereby a cyclocarbosilane easily polymerized to high molecular weight, a resist pattern was formed with high sensitivity at a low dose. Since the novolak resin was mixed as a solution inhibitor, the aqueous organic alkaline solution could be used as a developing solution. Since a silicon content of the resist was very high, etching resistance thereof was excellent, thus allowing good transfer of the resist pattern.

EXAMPLE 2

Figure 2A:
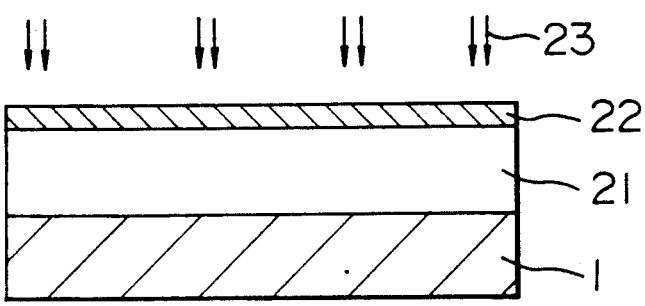
Figure 2B:
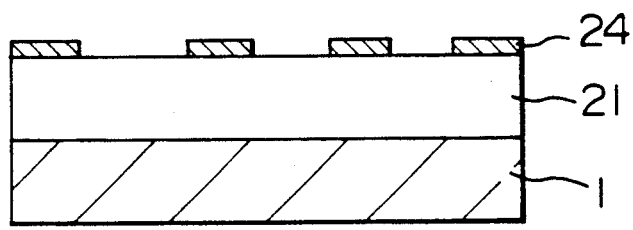
Figure 2C:
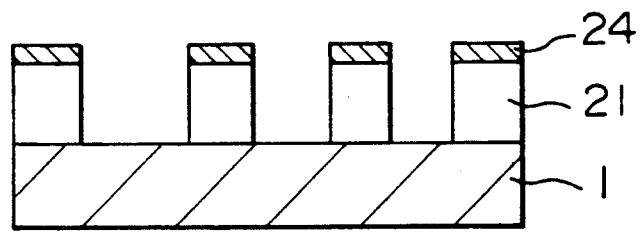
Figure 4A:
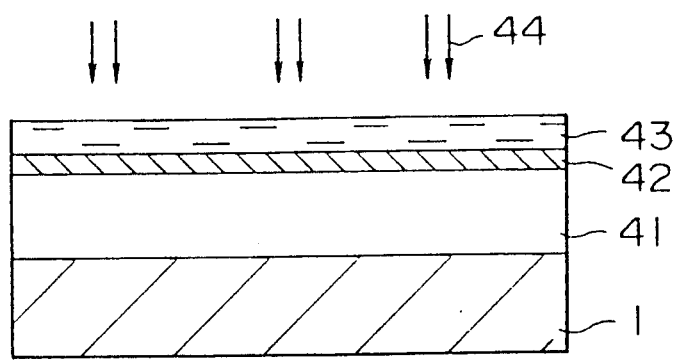
FIG. 4A-FIG. 4D are cross sections of a conventional three-layer resist process.
Figure 4B:
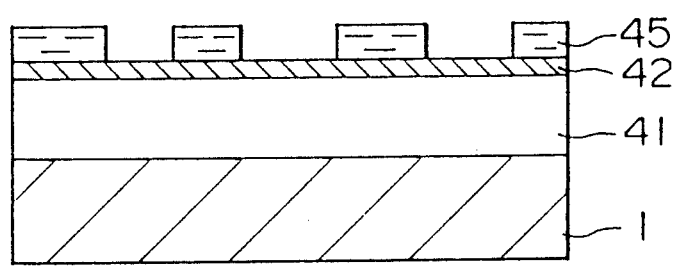
Figure 4C:
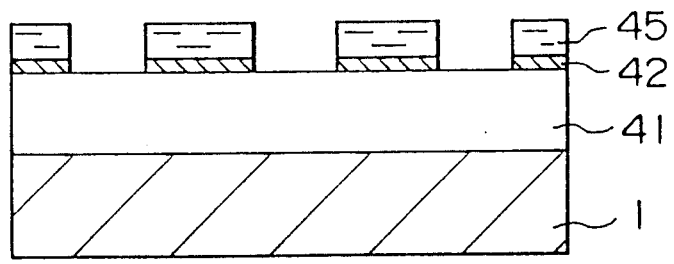
Figure 4D:
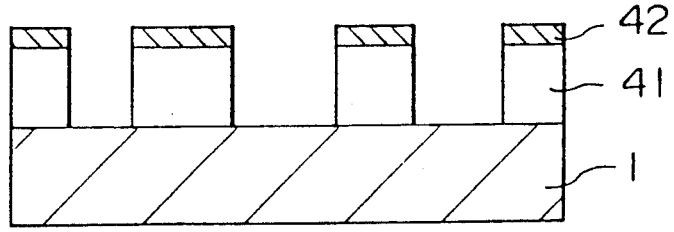

This example is explained with reference to FIG. 2A to FIG. 2C. Novolak resin was applied to a thickness of 2 μm on a semiconductor substrate 1 for forming the organic polymer film constituting the bottom layer 21, and baked at 220° C. for 20 minutes. The resist used in Referential Example 2 was applied on the organic polymer film as an electron beam resist 22 to a thickness of 0.3 μm and baked at 150° C. for 20 minutes (FIG. 2A). Next the resist was exposed to electron beam 23 at an accelerating voltage of 30 kV and a dose of 10 μC/cm². By developing with MIBK, a precise fine resist pattern 24 was obtained (FIG. 2B). By etching the bottom layer 21 while using this resist pattern as a mask, a precise vertical fine resist pattern was produced (FIG. 2C).

As explained above, in this example, by using a high sensitivity silicon-containing resist as the top layer resist of the double layer resist, a high precision fine resist pattern was produced.

EXAMPLE 3

This example is explained with reference to FIG. 3A to 3C. Novolak resin was applied to a thickness of 2 μm on a semiconductor substrate 1 for forming the organic polymer film constituting the bottom layer 31, and baked at 220° C. for 20 minutes. The resist used in Referential Example 3 was applied on the organic polymer layer as an electron beam resist 32 to a thickness of 0.3 μm and baked at 150° C. for 20 minutes (FIG. 3A). This was exposed to electron beam 33 at an accelerating voltage of 20 kV and a dose of 10 μC/cm², and after development with MIBK, a precise fine resist pattern 34 was obtained (FIG. 3B). By using this resist pattern as a mask and etching the bottom layer 31, a precise and vertical fine resist pattern was produced (FIG. 3C).

What is claimed is:

1. A process for forming a fine pattern comprising the steps of forming an organic polymer film on a semiconductor substrate followed by heat treatment, applying a resist comprising a cyclocarbosilane represented by the formula (I):

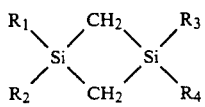

where $R_1$, $R_2$, $R_3$, and $R_4$ are each hydrogen or an alkyl group, a polymer resin and a photo initiator, on the organic polymer film followed by heat treatment, exposing to an electric charged beam, forming a resist pattern by developing, and etching the organic polymer film while using the resist pattern as a mask, wherein the photo initiator is a photo acid generator.

2. A process for forming a fine pattern according to claim 1, wherein the photo acid generator is an organic halide.

3. A process for forming a fine pattern comprising the steps of forming an organic polymer film on a semiconductor substrate followed by heat treatment, applying a resist comprising a cyclocarbosilane represented by the formula (I):

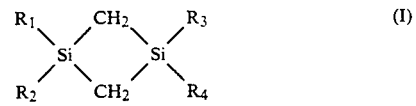

where $R_1$, $R_2$, $R_3$, and $R_4$ are each hydrogen or an alkyl group, a polymer resin and a photo initiator, on the organic polymer film followed by heat treatment, exposing to an electric charged beam, forming a resist pattern by developing, and etching the organic polymer film while using the resist pattern as a mask, wherein a polysilane represented by the formula (II):

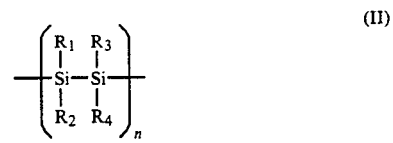

where $R_1$, $R_2$, $R_3$ and $R_4$ are each hydrogen or an alkyl group, and n is a positive integer, is used as a substance having both the function of said polymer resin and the function of said photo initiator.

4. A process for forming a fine pattern comprising the steps of forming an organic polymer film on a semiconductor substrate followed by heat treatment, applying a resist comprising a cyclocarbosilane represented by the formula (I):

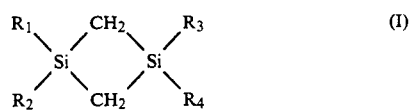

where $R_1$, $R_2$, $R_3$, and $R_4$ are each hydrogen or an alkyl group, a polymer resin and a photo initiator, on the organic polymer film followed by heat treatment, exposing to an electric charged beam, forming a resist pattern by developing, and etching the organic polymer film while using the resist pattern as a mask, wherein a polydisilanylene phenylene represented by the formula (III):

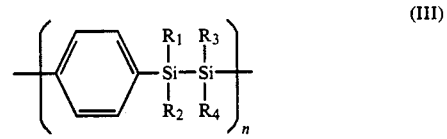

where $R_1$, $R_2$, $R_3$ and $R_4$ are each hydrogen or an alkyl group, and n is a positive integer, is used as a substance having both the function of said polymer resin and the function of said photo initiator.

* * * * *